United States Patent [19]
Evans et al.

[11] Patent Number: 5,810,031
[45] Date of Patent: Sep. 22, 1998

[54] ULTRA HIGH PURITY GAS DISTRIBUTION COMPONENT WITH INTEGRAL VALVED COUPLING AND METHODS FOR ITS USE

[75] Inventors: Bryce Evans, Jackson; Helen E. Rebenne, Ann Arbor, both of Mich.

[73] Assignee: Aeroquip Corporation, Maumee, Ohio

[21] Appl. No.: 604,451

[22] Filed: Feb. 21, 1996

[51] Int. Cl.⁶ .............................................. F16K 31/122
[52] U.S. Cl. .................. 137/557; 137/269; 137/545; 137/614.21
[58] Field of Search ............... 137/614.21, 557, 137/269, 271, 545, 884

[56] References Cited

U.S. PATENT DOCUMENTS

| | | |
|---|---|---|
| 1,000,945 | 8/1911 | Ray . |
| 1,082,512 | 12/1913 | Gainer . |
| 2,120,677 | 6/1938 | Oliver . |
| 2,335,832 | 11/1943 | Williams . |
| 2,372,820 | 4/1945 | Gardes . |
| 2,758,611 | 8/1956 | Michaels . |
| 2,868,563 | 1/1959 | Wood . |
| 2,933,333 | 4/1960 | Bredtschneider et al. . |
| 3,134,395 | 5/1964 | Glasgow ........................ 137/614.21 X |
| 3,168,906 | 2/1965 | Brown . |
| 3,245,428 | 4/1966 | Klimak et al. . |
| 3,391,951 | 7/1968 | Miller . |
| 3,624,755 | 11/1971 | Lambert . |
| 3,831,984 | 8/1974 | Kutina et al. . |
| 3,874,410 | 4/1975 | Clark . |
| 3,902,694 | 9/1975 | Freidell . |
| 4,089,341 | 5/1978 | Okaya . |
| 4,164,959 | 8/1979 | Wurzburger .................. 137/614.21 X |
| 4,543,992 | 10/1985 | Palmer . |
| 4,664,149 | 5/1987 | Fremy . |
| 4,816,083 | 3/1989 | Bangyan ................................. 137/271 |
| 4,949,745 | 8/1990 | McKeon . |
| 4,974,635 | 12/1990 | Hanus et al. . |
| 4,986,299 | 1/1991 | Schultz ................................... 137/269 |
| 4,989,638 | 2/1991 | Tervo . |
| 4,995,589 | 2/1991 | Adishian et al. .................. 251/63.5 X |
| 5,088,519 | 2/1992 | Giroux et al. . |
| 5,139,225 | 8/1992 | Olson et al. ........................... 251/61.2 |
| 5,215,120 | 6/1993 | Nimberger et al. . |
| 5,222,524 | 6/1993 | Sekler et al. ............................. 137/884 |
| 5,295,507 | 3/1994 | Bandy et al. . |
| 5,316,033 | 5/1994 | Schumacher et al. . |
| 5,379,793 | 1/1995 | Powell . |

FOREIGN PATENT DOCUMENTS

| | | | |
|---|---|---|---|
| 0 751 301 A2 | 1/1997 | European Pat. Off. | ........ F15B 13/00 |
| 0 754 896 A2 | 1/1997 | European Pat. Off. | ........ F16K 27/00 |
| 8-312900 | 11/1996 | Japan | ................ F17D 1/02 |
| WO 96/29529 | 9/1996 | WIPO | ............................ F16K 11/10 |
| WO 96/34705 | 11/1996 | WIPO | ............................. B08B 9/02 |

*Primary Examiner*—A. Michael Chambers
*Attorney, Agent, or Firm*—Wood, Herron & Evans, L.L.P.

[57] ABSTRACT

Valved couplers and gas processing components particularly suitable for ultra-high purity gas distribution for use in semiconductor manufacturing. In the couplers, a valve stem/bullnose seals the aperture of the coupler immediately adjacent the exterior of the coupler, so that only a minimal amount of the wetted surface of the coupler is exposed to the external environment. A gas processing component (e.g., a filter), or an entire integrated gas stick assembly, may be sealed from the exterior environment at both its inlet and outlet sides, by these valved couplers. As a result, the entire device can be purged after manufacture and left in a controlled environment during shipment and installation, reducing the need for purging after installation.

21 Claims, 5 Drawing Sheets

ULTRA HIGH PURITY GAS DISTRIBUTION COMPONENT WITH INTEGRAL VALVED COUPLING AND METHODS FOR ITS USE

CROSS REFERENCE TO RELATED APPLICATIONS

This application is related to a copending application entitled VALVED COUPLING FOR ULTRA HIGH PURITY GAS DISTRIBUTION SYSTEMS, filed Feb. 21, 1996 and assigned to the same assignee now U.S. Pat. No. 5,664,759, issued Sep. 9, 1997.

FIELD OF THE INVENTION

The present invention relates to gas distribution systems for ultra-high purity gas, such as systems used to provide process gasses for semiconductor manufacturing

BACKGROUND OF THE INVENTION

High purity gas distribution systems, such as are used in semiconductor manufacturing or other thin film coating processes, typically include a source of high purity gas coupled through a series of gas processing elements such as a mass flow controller, pressure sensor and/or regulator, heater, filters or purifiers, and shutoff valves. In semiconductor processing, a series-connected set of such elements is referred to as a "gas stick". In a typical semiconductor processing apparatus, multiple gas sources are connected to the chamber through multiple gas sticks, which are typically mounted to a frame, forming a complete assembly known as a "gas box".

As the dimensions of semiconductor devices decrease and their density increases, semiconductor manufacturing processes have become increasingly intolerant of particulate contamination. One important source of such contamination is the gasses used during the process, and particularly particulate carried by the wetted surfaces of the gas stick which delivers gas from the source to the chamber. Moisture or dust which accumulates within a gas stick or processing component will be carried with the source gas and deposit onto the semiconductor devices being processed, creating defects. Moisture also may corrode the wetted surfaces, leading to flaking of particles from these surfaces.

To reduce contamination of this sort, gas sticks and gas processing components for semiconductor processing are manufactured in low-dust, low-moisture environments, and purged for lengthy periods of time at elevated pressures after manufacture. Furthermore, gas processing components are typically packaged and sealed in pressurized nitrogen for shipment. As a result, the interior of the component or stick is exposed only to the clean room environment in which the semiconductor processing equipment is located, and only for the brief period of time between removal of the packaging and sealing of the stick or component into the processing equipment.

Despite these careful handing procedures, even brief exposure of a gas stick or component to clean room air results in the accumulation of potentially damaging levels of particulate and moisture within the stick or component, requiring extensive purging of the gas stick after assembly, and prior to further use for semiconductor manufacturing. Because the semiconductor manufacturing equipment cannot operate during purging, the time needed for purging represents substantial lost revenue.

The gas processing components in a gas stick, and other components and connections in the gas distribution system, will wear and need replacement at various frequencies throughout the life of the processing apparatus. Typically, a component is replaced by closing the valves most nearly adjacent to the component, uncoupling and replacing the component, and reopening the adjacent valves. To simplify this operation and minimize the extent of the gas stick exposed to room air during this procedure, each component is typically connected to its neighboring components or tubing with removable couplers, and valves are placed between components at several locations along the stick. Nevertheless, the act of uncoupling a component or portion of the stick and removing it from the stick exposes that component and the replacement component to room air, and also exposes substantial wetted surface between the component and the nearest valves (including the inside of any connecting tubing, and potentially other components), to room air. Thus, the gas stick must be extensively purged when the components are reassembled.

SUMMARY OF THE INVENTION

The difficulties are alleviated in accordance with principles of the present invention, through the use of valved couplers particularly suitable for an ultra-high purity gas distribution system. These valved couplers may be integrally incorporated into a gas processing component and/or connected between such components, to permit replacement of components or changes to connections between components while exposing only a minute wetted surface area of the gas distribution system to room air. As a particular example, valved couplers may be integrally incorporated into the inlet and outlet of a gas stick, to permit replacement of the entire gas stick.

Specifically, a valved coupler in accordance with principles of the present invention has a valve stem/bullnose structure for sealing an aperture of the coupler. The bullnose seals the aperture immediately adjacent the exterior of the coupler; the valve stem and bullnose move on an axis extending through the aperture, and when the bullnose is in position for sealing this aperture, the end of the bullnose is substantially coplanar with the outside of the housing. As a result, when the bullnose is in this sealed position, only a minimal amount of the wetted surface of the coupler is exposed to the external environment.

In the first embodiment of the invention discussed below, the bullnose seals at an interior side of the aperture, and is withdrawn into the coupler to permit gas flow. In an alternative embodiment, the bullnose seals an exterior side of the aperture, and is moved outwardly from the coupler to permit gas flow.

The valve stem may be pneumatically driven by a piston and cylinder arrangement connected to the coupler housing, or may be manually actuated. The pneumatically-actuated valve described below includes a return spring, which generates a force driving the bullnose into sealing engagement with the aperture, so that the valve is normally sealed in the absence of pneumatic pressure. As an alternative embodiment, the return spring drives the bullnose out of sealing engagement, so that the valve is normally open in the absence of pneumatic pressure. In a second alternative embodiment, a rack-and-pinion arrangement transfers vertically-directed force from the pneumatic or manual actuator, to a horizontally-oriented valve stem.

In another aspect, the invention features a gas processing component (e.g., a filter), or entire gas stick, which is sealed from the exterior environment at both its inlet and outlet sides, by valved couplers of the kind described above.

Because the couplers seal the internal wetted surfaces of the component/gas stick from exposure to the external environment, the entire device can be purged at the manufacturing site and left flooded with a controlled environment (e.g., pure Nitrogen at a pressure slightly elevated above atmospheric) during shipment, such that the component/gas stick can be installed and used after only brief purging.

The gas stick described below includes valved couplers integrally manufactured into the housing of the gas stick, and further includes a mass flow controller, dual filters on the inlet and outlet sides of the mass flow controller, a pressure sensor, thermocouple, and heater. Additional elements such as a pressure regulator or purifier could also be integrally included in the gas stick as necessitated by the application.

In a further aspect the invention features methods of using these devices. In particular, when two valved couplers are joined together, they may be used as shutoff valves by the gas processing apparatus. Because two conjoined couplers include two separate valves, and either valve can shut off gas flow through the couplers, wear caused by repetitive cycling of the valves can be distributed between the valves, resulting in increased lifetime of the conjoined couplers as compared to a separate shutoff valve.

In a further aspect the invention features the above-described method of pre-purging a component and shipping the component in a purged, controlled environment between two sealed couplers.

The above and other objects and advantages of the present invention shall be made apparent from the accompanying drawings and the description thereof.

BRIEF DESCRIPTION OF THE DRAWING

The accompanying drawings, which are incorporated in and constitute a part of this specification, illustrate embodiments of the invention and, together with a general description of the invention given above, and the detailed description of the embodiments given below, serve to explain the principles of the invention.

DETAILED DESCRIPTION OF SPECIFIC EMBODIMENTS

Figure 1:
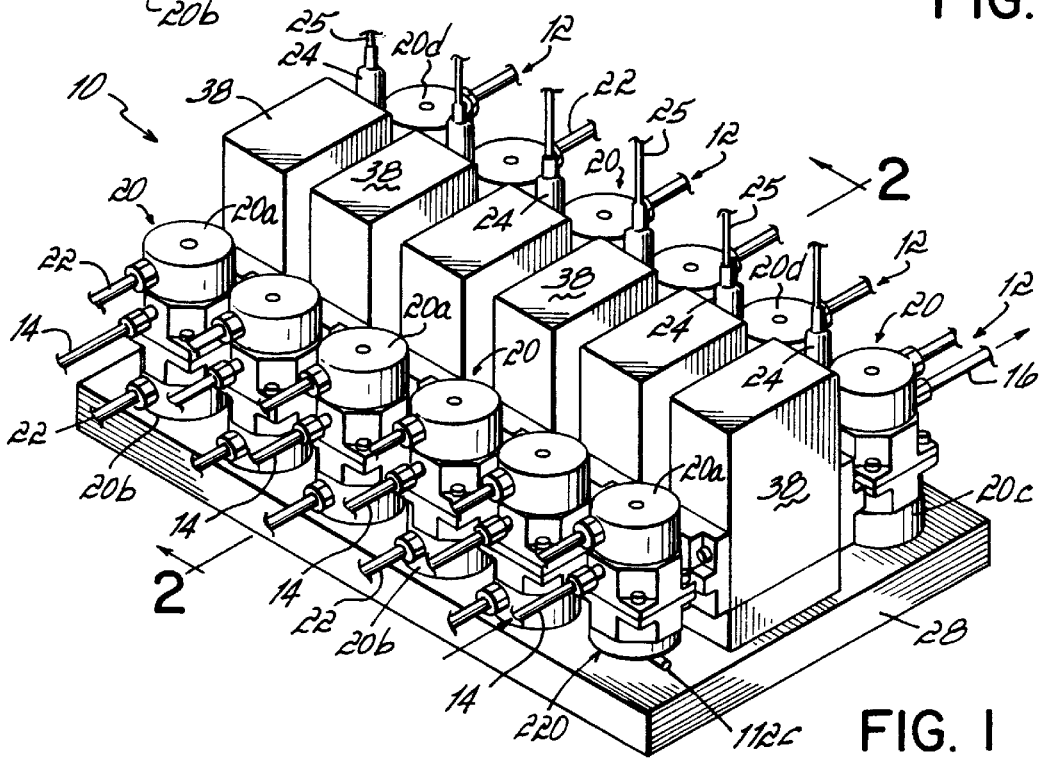
FIG. 1 is a schematic perspective view of a gas box formed of integrated gas stick/valved coupler assemblies in accordance with principles of the present invention.
Figure 2:
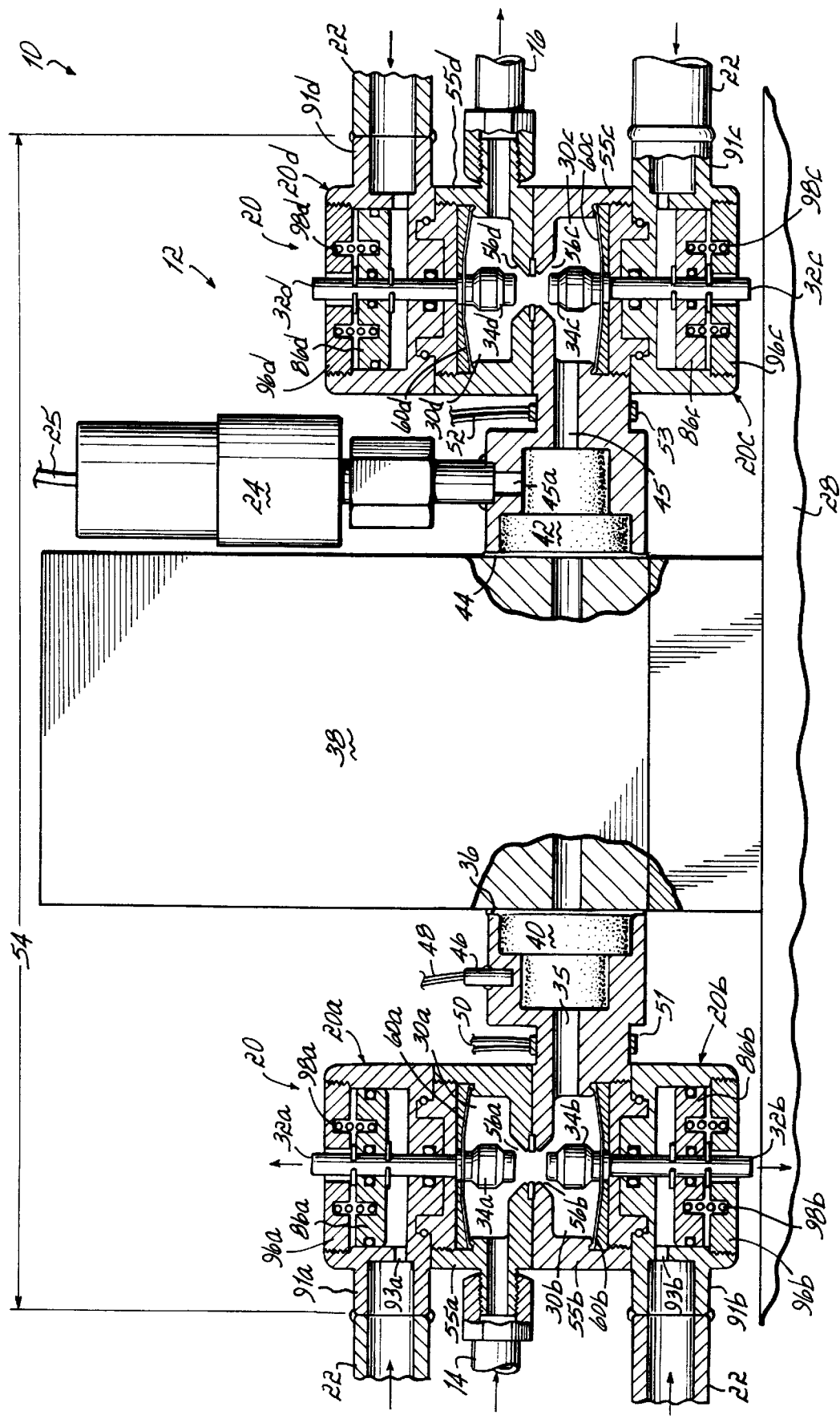
FIG. 2 is a partial cross-sectional view of a gas stick of FIG. 1 taken along lines 2—2, but showing pneumatic control lines welded to tube-stub connections on the valved coupler, to illustrate an alternative to the threaded couplers shown in FIG. 1.

Referring to FIGS. 1 and 2, in accordance with principles of the present invention, a gas box 10 comprises a number, such as 6, of individual and separately controlled gas sticks 12. Each gas stick 12 receives a source gas for a semiconductor process on an input line 14 and outputs gas to the semiconductor processing chamber on an output line 16. Gas flow through each gas stick 12 is controlled by a plurality of valved couplers 20. These valved couplers respond to pneumatic actuation through pneumatic control lines 22, or in some cases may be manually actuated as shown at 220 and discussed in further detail below in FIG. 5.

Each gas stick 12 may optionally include additional elements, including a pressure sensor (transducer) 24, which produces an electrical pressure signal on a line 25, a thermocouple (46, FIG. 2) for detecting temperature of the gas stick 12, as well as heater blankets (bands) (51, 53, FIG. 2) for applying heat to the gas stick. Other elements might include a gas purifier.

Gas sticks 12 are firmly mounted to a support plate 28 which provides mechanical support for each gas stick 12 in the gas box 10. In accordance with principles of the present invention, the dimensions of each gas stick 12 are reduced as compared to typical gas sticks, such that support plate 28 may be attached to or part of existing semiconductor processing equipment in the clean room where the gas sticks are in operation. This substantially reduces the floor space used in the clean room and thereby substantially reduce the cost of its construction and operation.

A second advantage of the smaller gas stick dimensions is the reduction in wetted surface in the gas stick, which implies less opportunity for accumulation of moisture and/or particulate in the gas stick and less area subject to possible corrosion or outgassing.

Furthermore, the reduced size of the gas stick reduces the volume that must be purged, and thus reduces the purging time and the amount of purging gas consumed.

Finally, the integral construction of the gas stick provides fewer connections and seals and thus fewer potential leak paths for gasses from the gas stick to the surrounding environment, and also reduces the amount of steel used in the gas distribution system.

Referring now to FIG. 2, each gas stick incorporates four valved couplers 20a, 20b, 20c and 20d which connect the gas stick 12 to a gas supply and to gas distribution equipment in the processing chamber. The four valved couplers 20a, 20b, 20c and 20d shown in FIG. 2 have similar construction, but are positioned in different orientations, and in some cases integrally attached to housings of adjacent components.

In particular, the valving structure in coupler 20a is a mirror image of the structures in couplers 20b, 20c and 20d, although the main housings in each case are slightly differently shaped to accommodate different applications.

In the embodiment shown in FIG. 2, the lower valved couplers 20b and 20c are integrally mounted to the housing of a gas stick (including a mass flow controller 38 and pressure transducer 24) situated therebetween. Accordingly, the gas stick may be removed from the gas distribution system by disconnecting lower couplers 20b and 20c from mating upper couplers 20a and 20d, lifting upper couplers 20a and 20d from connection with lower couplers 20b and 20c, and removing the entire gas stick with lower couplers 20b and 20c attached thereto.

In an alternative embodiment (not shown), upper couplers 20a and 20d are integrally mounted to the gas stick (rather than lower couplers 20b and 20c), and these integral upper couplers 20a and 20d are mounted to separate lower couplers 20b and 20c which connect to input and output lines 14 and 16. In this alternative embodiment, after disconnection, the gas stick and upper couplers 20a and 20d attached thereto may be directly lifted off lower couplers 20b and 20c without requiring movement of lower couplers 20b and 20c.

Returning now to the embodiment shown in FIG. 2, a process gas input line 14 connects to the main valve chamber 30a of a first valved coupler 20a. (The connection to input line 14 and output line 16 may be a threaded joint as shown in FIG. 2, or lines 14 and 16 may be welded to a tube stub of the kind used on pneumatic control ports 91a/91b in FIG. 2.) This chamber 30a is cylindrical in profile, and is shown in cross-section in FIG. 2. A lower face of chamber 30a includes an aperture 56a passing through the housing. An axially-positioned valve stem 32a, terminating at one end in a bull nose 34a, moves along a center axis passing through aperture 56a such that bull nose may engage and seal aperture 56a.

Similarly, valved coupler 20b includes an aperture 56b and a stem 32b which moves along a center axis extending through aperture 56b and terminates at an end in a bull nose 34b sized for engagement and sealing of aperture 56b.

When valved couplers 20a and 20b are open, stems 32a and 32b translate to the positions shown in FIG. 2. In these positions, cylindrical main chamber 30a of coupler 20a is in fluid communication with cylindrical main chamber 30b of coupler 20b, via apertures 56a and 56b. Accordingly, input line 14 is in fluid communication with inlet passage 35 formed in the housing of coupler 20b.

Passage 35 is in communication with a mass flow controller 38 (the details of which are not shown) through a top-hat shaped filter 40. Filter 40 is fitted into a matching top-hat shaped chamber in housing 55b of coupler 20b. Filter 40 includes, at its outer periphery, a sealing nib which is engaged between housing 55b of coupler 20b and the housing of mass flow controller 38, to form a seal therebetween.

The outlet of mass flow controller 38 is coupled, through a second filter 42, to an outlet passageway 45 and a main cylindrical valve chamber 30c of a third valved coupler 20c. Filter 42 is mounted within the housing 55c of valved coupler 20c, and housing 55c is sealed to the housing of mass flow controller 38 by a sealing nib 44 on filter 42.

Valved coupler 20c, like valved couplers 20a and 20b, includes an aperture 56c and a valve stem 32c terminating at an interior end in a bull nose 34c. Similarly, valved coupler 20d includes an aperture 56d and a valve stem 32d terminating at its interior end in a bull nose 34d. When valve stems 32c and 32d are in their open positions, as shown in FIG. 2, main valve chamber 30c is in communication with a main valve chamber 30d of valved coupler 20d through apertures 56c and 56d. Accordingly, in these positions of valve stems 32c and 32d, outlet passageway 45 is in fluid communication via valve chambers 30c and 30d to output line 16 of the gas stick 12.

The pressure sensor 24 (the details of which are not shown) is in fluid communication with outlet passageway 45 via passageway 45a. Electrical signals from pressure sensor 24 are carried on line 25. These signals can be used, for example, to control the pneumatic lines controlling the positions of valve stems 32 so as to close the valved couplers and thereby shut off gas flow if the gas pressure drops below a set point.

Thermocouple 46 is in thermal communication with the wall of housing 55b adjacent to filter 40, and thereby detects the temperature of gas flowing through filter 40 to produce an electrical temperature signal on lines 48. Heater jackets (bands) 51, 53 surrounding inlet passageway 35 and outlet passageway 45 obtain electrical power through lines 50 and 52, respectively, and may be controlled in response to temperatures sensed by thermocouple 46 to regulate the temperature of the gas stick 12 to prevent gas condensation within the gas stick 12. (Heater cartridges could be used in place of heater bands, if desired.)

Gas stick 12 has an overall length as shown by numeral 54 of approximately nine inches. This dimension is substantially smaller than comparable dimensions of a typical gas stick assembly comprising discrete mass flow, pressure sensor and control valve housings and couplers therebetween.

As noted above, the compact size of the gas stick 12, in accordance with principles of the present invention, permits a substantial reduction in the clean room floor space consumed by the gas box 10. Indeed, in some applications the gas box 10 may be mounted on the processing chamber, thus freeing all floor space formerly required for the gas box. Furthermore, the compact size of the gas stick also advantageously reduces the number of seals in the system, the volume needed to be purged, and the wetted surface area, resulting in fewer opportunities for corrosion or outgassing.

It will be further noted that the gas stick 12 of FIG. 2 is an integral unit containing all processing components needed for gas delivery, including mass flow controller 38, and pressure sensor 24. Furthermore, as will be explained in greater detail in the following figures, the valved couplers 20a, 20b, 20c and 20d function not only as couplers for the gas stick, but also as automatically-actuatable shutoff valves which can be used to initiate and terminate gas flow as called for by the semiconductor processing "recipe" used with the processing chamber. The substantial reduction in size and number of seals in the gas stick 12, resulting from this integration of functions into a single unit, is a particular advantage of the present invention.

Figure 3:
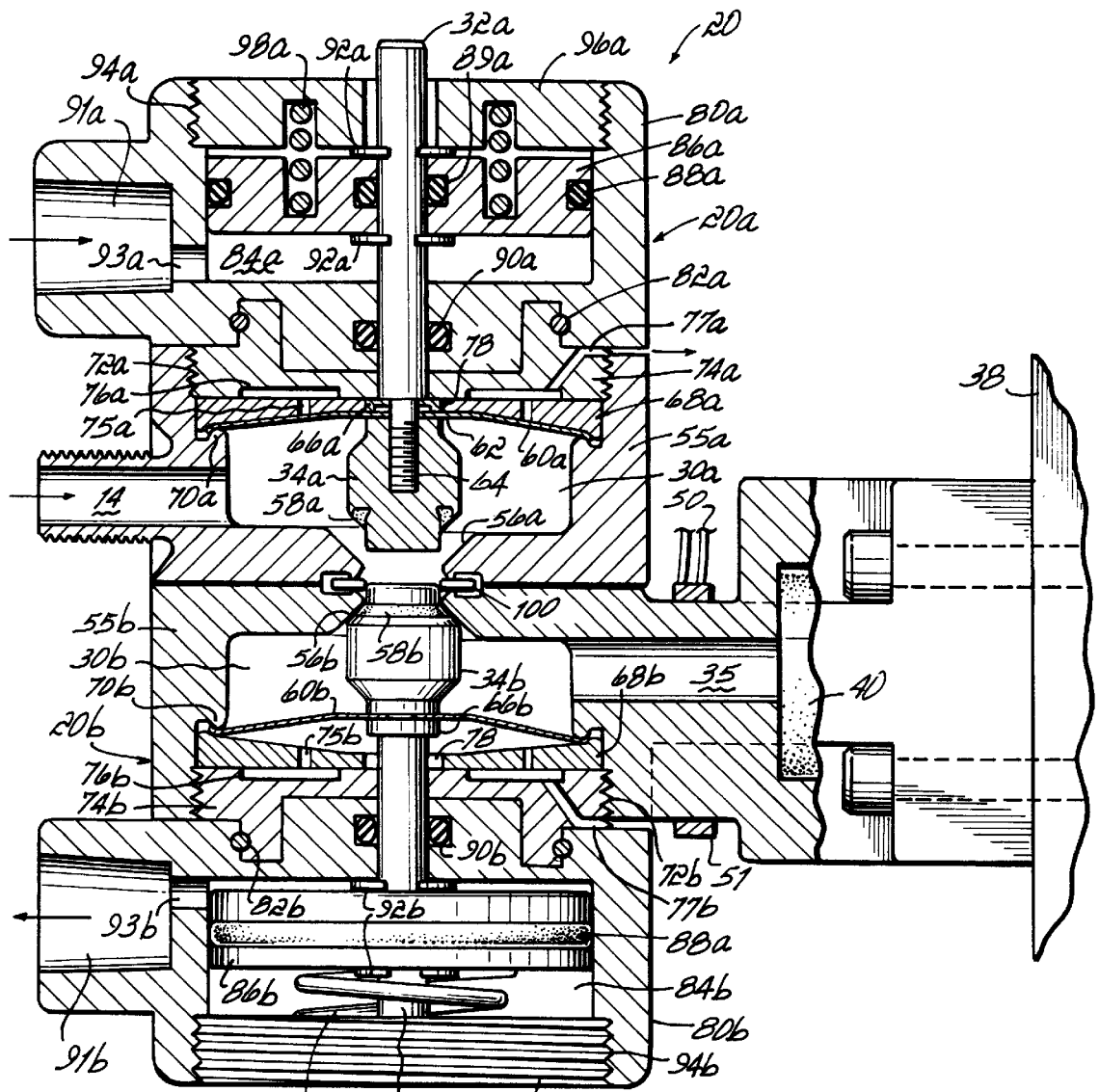
FIG. 3 is partial cross-sectional detail view of two valved couplers in the gas stick of FIG. 2.

Now referring to FIG. 3, it can be seen how valved coupler 20a or valved coupler 20b may be used as a flow control valve during operation of the gas stick 12. Specifically, comparing FIG. 3 to FIG. 2, valve stem 32b of valved coupler 20b has been moved to a closed position seen in FIG. 3. In this position, bull nose 34b engages to aperture 56b of coupler 20b to seal valve chamber 30b from valve chamber 30a of coupler 20a. To facilitate such sealing, each bull nose 34a and 34b includes on its lower perimeter, a gasket 58a and 58b for sealing against aperture 56a and 56b of housing 55a and 55b.

Additional details of a valved coupler 20 in accordance with one embodiment of the present invention are illustrated in FIG. 3. These details will be described in the context of valved coupler 20a and the corresponding elements in valved coupler 20b. However, the reader will appreciate that similar details appear in other valved couplers of the same type shown in FIGS. 2 and 5.

In the following, corresponding components in each of couplers 20a and 20b will be described simultaneously, while identifying the reference characters for both components.

Now turning to the details shown in FIG. 3, each coupler includes a diaphragm 60a/60b, respectively, which is a disk-shaped sheet of flexible metal material. Diaphragm 60a/60b seals the main valve chamber 30a/30b. Valve stem 32a/32b passes through a central aperture of diaphragm 60a/60b. In an axial region surrounding this central aperture, diaphragm 60a/60b is welded to bull nose 34a/34b as shown at 62 on diaphragm 60a.

An interior end of valve stem 32a/32b passes through diaphragm 60a/60b and terminates in a threaded end as seen at 64 on stem 32a. Bull nose 34a/34b includes internal threads for accepting an internal end of the respective valve stem 32a/32b. Above this threaded end 64 of valve stem 32a/32b, valve stem 32a/32b includes a radial projection 66a/66b having an outer diameter matched to an outer diameter of bull nose 34a/34b. Thus, by tightening the threaded end 64 of valve stem 32a/32b into bull nose 34a/34b, diaphragm 60a/60b is clamped between the valve stem projection 66a/66b and the bull nose 34a/34b. The result of this combined clamp and weld forms a positive seal between diaphragm 60a/60b and bull nose 34a/34b to minimize leakage in the space therebetween.

Main valve housing 55a/55b includes an internal annular projection 70a/70b sized for engagement to an outer periphery of diaphragm 60a/60b. A disk-shaped spacer 68a/68b, is inserted above diaphragm 60a/60b and engages an opposite peripheral rim of diaphragm 60a/60b. Diaphragm 60a/60b is thereby clamped between projection 70b/70b and spacer 68a/68b to positively lock diaphragm 60a/60b in place and minimize leakage between diaphragm 60a/60b and main housing 55a/55b. An outer periphery of diaphragm 60a/60b may also be welded or brazed to main housing 55a/55b to further reduce leakage therebetween.

Spacer 68a/68b includes, at its radially inwardmost position, a circular aperture as seen at 78 in valved coupler 20b. This aperture 78 has a diameter slightly larger than that of projection 66a/66b on valve stem 32a/32b. Accordingly, as illustrated in valved coupler 20a, when valve stem 32a/32b withdraws into main valve chamber 30a/30b and extracts bull nose 34a from engagement with housing 55a, valve stem projection 66a fits within annular aperture 78 to permit full withdrawal of bull nose 34a away from housing 55a.

Spacer 68a/68b has a concave inner surface conforming to diaphragm 60a/60b when bull nose 34a/34b is in an open position, such as seen in valved coupler 20a of FIG. 3. Spacer 68a/68b thereby provides support for diaphragm 60a/60b against gas pressure and prevents unnecessary flexing thereof.

Main housing 55a/55b includes threads 72a/72b along its cylindrical inner periphery for receiving a cylindrical compression head 74a/74b having mating threads on its exterior periphery. Compression head 74a/74b engages spacer 68a/68b and provides compressive force against spacer 68a/68b to clamp the peripheral rim of diaphragm 60a/60b between spacer 68a/68b and housing projection 70b/70b, as noted above.

Spacer 68a/68b further includes air passages such as 75a/75b passing therethrough in an axial direction. Air passage 75a/75b is in communication with an annular channel 76a/76b formed in compression head 74a/74b. A further channel 77a/77b formed in compression head 74a/74b leads from channel 76a/76b to the clean-room atmosphere surrounding valved coupler 20a/20b. Air passage 75a/75b and channels 76a/76b and 77a/77b permit air flow from a region behind diaphragm 60b to or from the clean-room atmosphere outside of valved coupler 20a/20b so that air pressure from a rear side of diaphragm 60a does not inhibit movement of valve stem 32a/32b.

In pneumatically-actuated embodiments of a valved coupler, such as are shown in FIG. 3, main housing 55a/55b attaches to a drive housing 80a/80b. Drive housing 80a/80b is attached to main housing 55a/55b by a drive wire 82a/82b inserted into an annular channel formed between compression head 74a/74b and drive housing 80a/80b. This drive wire 82a/82b connection permits drive housing 80a/80b to rotate relative to main housing 55a/55b about their central axes as needed to permit connection of pneumatic gas to drive housing 80a/80b.

Drive housing 80a/80b surrounds valve stem 32a/32b and includes a pneumatic piston-and-cylinder for driving stem 32a/32b to an open or closed position. Specifically, housing 80a/80b defines a central cylinder 84a/84b. A piston 86a/86b mounted to stem 32a/32b is slidably positioned within cylinder 84a/84b. Piston 86a/86b is actuated axially through housing 80a/80b by pneumatic pressure from pressurized gas injected into cylinder 84a/84b via a pneumatic control line 22 (see FIGS. 1 and 2) welded to tube-stub forming a pneumatic control port 91a/91b. (Alternatively, as seen in FIG. 1, pneumatic control lines may be threadedly coupled to pneumatic control port 91a/91b, in which case the port might be smaller in diameter.) Valve stem 32a/32b carries grooves for retaining annular locking rings 92a/92b on opposite sides of piston 86a/86b, such that valve stem 32a/32b is mechanically coupled to movements of piston 86a/86b.

A passage 93a/93b carries pressurized gas from control ports 91a/91b to a front side of piston 86a/86b, so that when pressure is applied, piston 86a/86b is driven from the position shown in drive housing 80b to the position shown in drive housing 80a.

Housing 80a/80b includes interior threads at 94a/94b for receiving a cylindrical cap 94b/94b which is similarly threaded at its exterior cylindrical surface. A helical compression spring 98a/98b is captured between cap 96a/96b and piston 86a/86b. Spring 98a/98b provides an expansive force against piston 86a/86b and stem 32a/32b driving these elements toward main housing 55a/55b to cause sealing engagement of bull nose 34a/34b with aperture 56a/56b of housing 55a/55b. Thus, when pneumatic pressure is removed, spring 98a/98b automatically causes closure of valved coupler 20a/20b.

In accordance with the above description, it will be appreciated that the valve structure shown in FIG. 3 is a "normally closed" valve, i.e., it will close and remain closed when pneumatic pressure is removed. In an alternative embodiment for a specific application, a "normally open" valve could also be fabricated by forming channel 93a/93b to communicate between control ports 91a/91b and the space between a rear side of piston 86a/86b and cap 96a/96b. Also the orientation of piston 86a/86b and position of spring 98a/98b would be reversed such that spring 98a/98b is captured between a front side of piston 86a/86b and housing 80a/80b. Finally, an air passage from the housing to the external environment would be provided to permit air captured between a front side of piston 86a/86b and housing 80a/80b to vent to the exterior environment.

Main housing 55b of valved coupler 20b is permanently mounted to the housing of mass flow controller 38 to form a gas stick 12, as is seen in its entirety in FIG. 2. Accordingly, housing 55b of coupler 20b includes passage 35 which connects to the inlet of the mass flow controller. Furthermore, main housing 55b includes a heater jacket 51 attached to power lines 50. Referring back to FIG. 2, it will be seen that coupler 20c is also integrally formed with an output side of gas stick 12, and contains structures which are similar, but mirror-image, to those found in coupler 20b.

Figure 4:
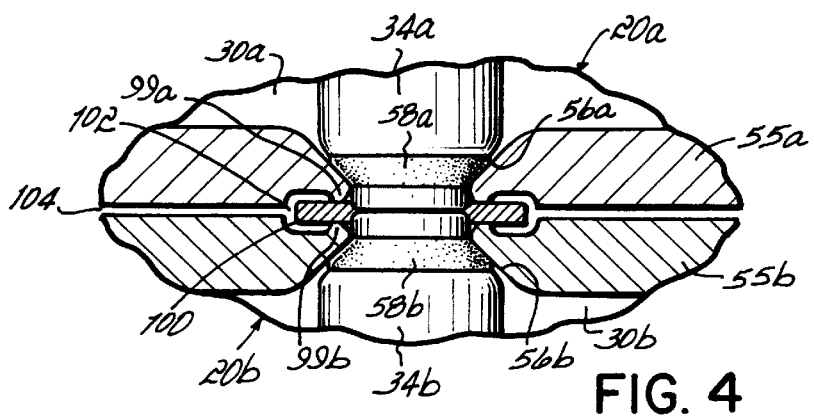
FIG. 4 is an enlarged cross-sectional view of the joint between the two valved couplers of FIG. 3.

Referring now to FIG. 4, the details of the passageway adjoining mating valved couplers can be examined. This passageway is formed by the apertures 56a and 56b into housings 55a and 55b of couplers 20a and 20b. Housings 55a and 55b include, at the outer peripheries of apertures 56a, 56b, respective annular clamping jaws 99a and 99b. These jaws mate to form a circular clamping structure 102 surrounding apertures 56a and 56b. A packing gland 100 (deformable washer), is inserted into the circular clamp 102 formed by jaws 99a and 99b. Packing gland 100 forms a fluid tight seal preventing seepage of fluid from apertures 56a and 56b and the passageway therebetween, into the joint 104 between housings 55a and 55b. Packing gland 100 is permanently deformed between jaws 99a and 99b when housings 55a and 55b are conjoined, and must be replaced after each separation of housings 55a and 55b.

As is best seen in FIG. 4, when the bull noses 34a and 34b are both in their closed positions shown in FIG. 4, both of apertures 56a and 56b are sealed. Furthermore, the bull noses 34a and 34b are substantially coplanar with the exterior surfaces of the valve housing along joint 104. As a result, only a minuscule volume is contained in the region between bull noses 34a and 34b.

In use, the valved coupler structure shown in the FIGS. 1–4 provides a substantially improved coupling and shutoff valve for ultra high purity gas processing applications such as semiconductor manufacturing. As can be best seen, for example, in FIG. 2, the valved couplers form matable pairs. When both valves of a matable pair of couplers are in the off position, as seen in FIG. 4, substantially no wetted surface of the inside of the valve will be exposed to external air when the coupler is separated (see FIG. 5, discussed below). Thus, the couplers may be separated without leakage of atmosphere into the coupler valve chambers 30a and 30b through apertures 56a and 56b, and thus without accumulation of moisture or dust within the couplers or the attached gas processing elements.

Furthermore, it will be noted that, when the valved couplers are disconnected in the closed position, the only internal wetted surface of the valve which is exposed to atmosphere is a small area at the extreme end of the bull nose. Accordingly, only this small area may accumulate dust or moisture when the valved couplers are disconnected and reconnected. Thus, contamination of internal wetted surface of tubing or gas processing elements connected by the couplers will be substantially reduced and the purging required upon replacement of an element substantially reduced.

Accordingly, in accordance with principles of the present invention, valved couplers are positioned on opposing sides of a gas processing element to facilitate replacement of that element without substantial contamination. Thus, an entire gas stick 12, as seen in FIG. 2, may be surrounded by valved couplers 20 so that the entire gas stick 12 may be replaced without substantial contamination of the attached tubing. In an alternative application, shown in FIG. 5, an individual component of the gas distribution system or gas stick, such as a filter 120 or as an alternative example a gas purifier, is coupled to the remainder of the system or stick by a pair of valved couplers 20b and 20c so that this element may be removed and replaced without substantial contamination of either the filter or the remainder of the gas stick.

For each of these applications, it is contemplated that separate components (FIG. 5), or an entire gas stick (FIG. 2), will be supplied from a manufacturer with the valved couplers surrounding the component factory-sealed, with the component preserved therebetween in a controlled environment, such as in pure Nitrogen at a pressure slightly above atmospheric. Furthermore, it is contemplated that the component will be factory-purged of any impurities prior to factory-sealing of the associated valved couplers.

Specifically, it is contemplated that a gas stick or component will be heated in a vacuum oven to bake out impurities, and then back filled with pure Nitrogen for several cycles to remove all air and moisture. Subsequently, the clean assembly will be charged with Nitrogen and placed in sealed Nitrogen filled bags for shipment. As a result, when the gas stick or component is added to the gas distribution system, it need only be briefly purged to eliminate any impurities acquired by the small wetted surfaces of the end of bullnose 34 during its brief exposure to clean room air, and then immediately thereafter used in processing. Because the individual component or entire gas stick is supplied pre-purged, and internal wetted surfaces thereof are not exposed to contamination from air, delays for purging are substantially reduced as compared to those needed when replacing a component in a typical gas sticks in the prior art.

In an embodiment where, for example, a gas purifier is isolated between valved couplers in this manner, the present invention has particular advantage, in that purifier elements are often consumed by room air. The isolation procedure described above would prevent even brief exposure of the purifier element to room air and thus substantially reduce consumption of the element by room air during installation. (The use of couplers in accordance with the present invention in conjunction with a gas purifier will be noted below in connection with FIG. 9.)

An additional advantage of the valved coupler structure described herein is the inclusion of dual valves within each coupler joint. Specifically, the valve formed by a bull nose 34 and associated housing aperture 56 may be used as a shutoff valve during semiconductor processing, by automatic or manual (see below) actuation of the valve stem 32 and bull nose 34.

Typically, shutoff valves are positioned on either side of a mass flow controller and both shutoff valves are closed when gas flow is halted. In a typical gas stick, these shutoff valves are coupled to a mass flow controller through separate couplers and tubing.

By providing a combined coupler and shutoff valve, the present invention substantially reduces the size and complexity of a gas stick. The integration of both functions into a single integral unit such as shown in FIG. 2, permits substantial reduction in the size of a gas stick, with the resulting advantages identified above.

Another advantage arises from the provision for dual shutoff valves at each coupling. Specifically, as can be seen in FIG. 3, one coupler of a pair of valved couplers may be used as a shutoff valve while the other coupler is held in an open position. For example, comparing FIG. 2 to FIG. 3, a shutoff function may be achieved by cycling valved coupler 20b between open and closed positions while holding 20a in an open position. By cycling one coupler in this manner while holding the opposing coupler open, only one coupler accumulates wear while the other coupler remains unused. Accordingly, when coupler 20b nears the end of its useful life, the roles of the couplers may be reversed, and coupler 20a cycled thereafter to provide shutoff valving. As a consequence, the useful life of the shutoff valves in a pair of valved couplers, can be as much as twice the useful life of a single shutoff valve. By thus extending the useful life of the shutoff valves, the valved coupler structure of the invention may extend the time between refurbishments of the gas stick due to valve wear, and enhance productivity.

Figure 5:
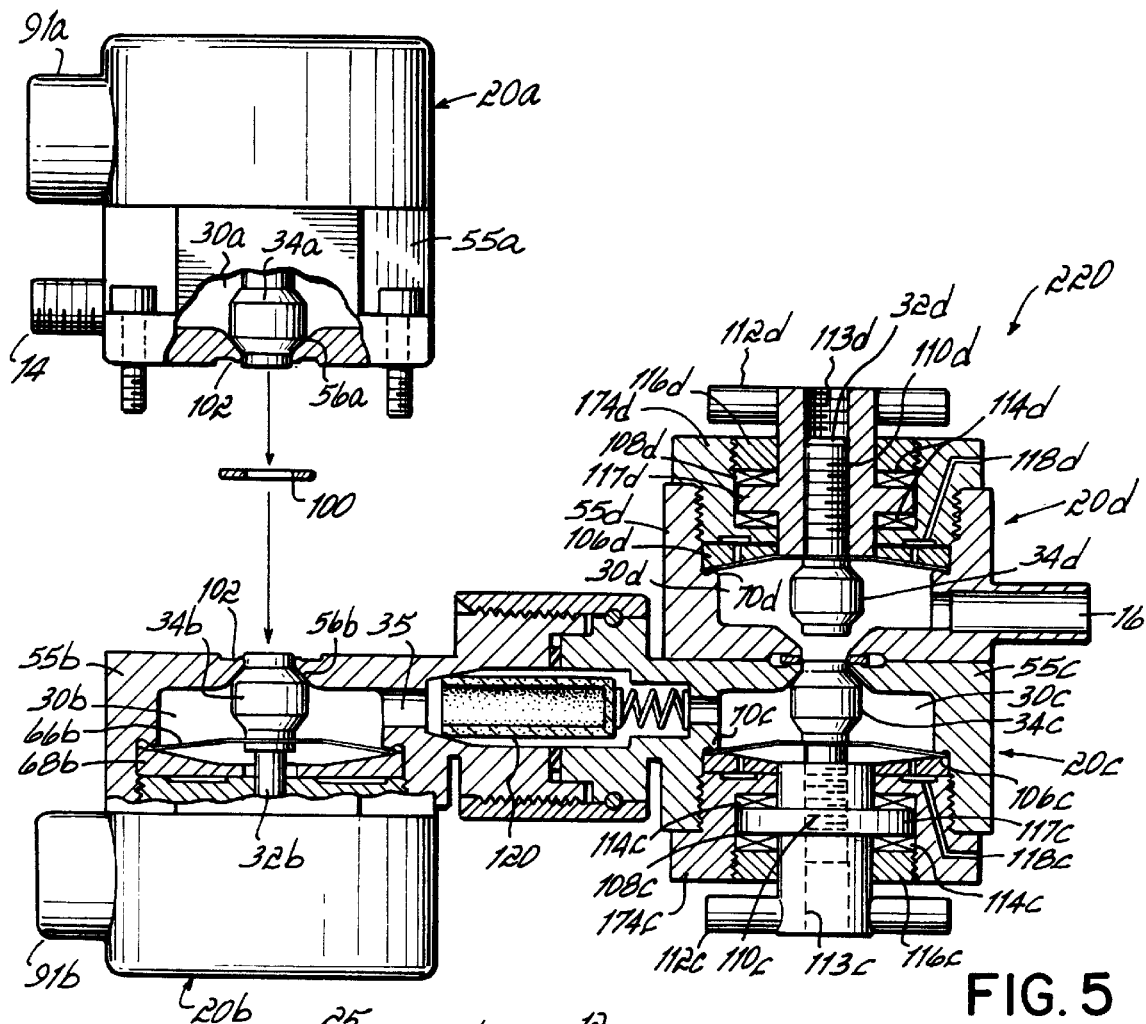
FIG. 5 is a partial cross-sectional view of a filter having integrated valved couplers in accordance with a second embodiment of the invention, and showing the uncoupling of such couplers.

Now turning to a detailed discussion of FIG. 5, an alternative embodiment of a valved coupler 20c and 20d provides for manual actuation of the valve stem 32c/32d. In this embodiment, certain parts of the pneumatically actuated valve discussed above are modified to provide manual actuation. As was the case in FIG. 3, elements of couplers 20c and 20d (other than the main housings 55c and 55d) have mirror-image construction, and for clarity like elements from both couplers will be discussed below simultaneously, with reference to corresponding reference numerals.

In this manually-actuated embodiment, the main valve chamber 30c/30d and diaphragm 60c/60d are identical to those used in a pneumatically-actuated valved coupler such as those discussed above with reference to FIG. 3. Furthermore, diaphragm 60c/60d is welded/clamped to bullnose 34c/34d and stem 32c/32d and housing 55c/55d in a manner identical to that discussed above with reference to FIG. 3.

The manually-actuated embodiment differs from the pneumatically actuated embodiment of FIG. 3, in that a modified valve stem 32c/32d is used in conjunction with an alternative compression head 174c/174d and spacer 106c/106d, in place of the stem 32a/32b, compression head 74a/74b, and drive housing 80a/80b shown in FIG. 3. Specifically, the modified spacer 106c/106d has a central aperture sized slightly larger than the outer diameter of handle 112c/112d to fit around the innermost end of handle 112c/112d. As in the prior embodiment, compression head 174c/174d is threaded at its outer periphery for engagement to an inner threaded periphery of housing 55c/55d, and drives spacer 106c/106d into engagement with diaphragm 60c/60d opposite housing projection 70c/70d. Accordingly, spacer 106c/106d compresses and seals diaphragm 106c/106d to main housing 55c/55d and minimizes leakage therebetween.

Compression head 174c/174d is formed with a central cylindrical recess 108c/108d for supporting the manual actuation handle 112c/112d and accompanying bearings, etc. An end of valve stem 32c/32d opposite bull nose 34c/34d extends into this recess 108c/108d. This end of valve stem 32c/32d includes external threads 110c/110d. Handle 112c/112d inserted in recess 108c/108d includes a bore 113c/113d having threads matable with threads 110c/110d of valve stem 32c/32d.

Handle 112c/112d also includes an annular projection 117c/117d sized for insertion within recess 108c/108d to axially constrain handle 112c/112d but permit rotation. Annular bearings 114c/114d are fitted on opposing sides of projection 117c/117d to permit rotation thereof while constraining axial movement of handle 112c/112d. A cap 116c/116d fitted into recess 108c/108d constrains axial movement of bearings 114c/114d and handle 112c/112d.

A channel 118c/118d formed in compression head 174c/174d provides a path for air flow to/from a rearward side of diaphragm 60c/60d through spacer 106c/106d, and thus prevents air compression behind diaphragm 60c/60d that would otherwise inhibit opening or closing of the valve (as was the case with channels 75/76/77 of the pneumatically-actuated valve of FIG. 3).

When the valve has been manually actuated to a fully open position, as shown in coupler 20d, diaphragm 60d abuts an underside of handle 112d and spacer 106d. This prevents further rotation of handle 112d and over-travel of diaphragm 60d.

In use of the foregoing structure, rotation of handle 112c/112d causes axial translation of valve stem 32c/32d axially toward or away from housing 55c/55d to or from an open end closed position. Thus, the valve of the valved coupler may be manually actuated using handle.

Manually actuable valved couplers may be used in applications where a pneumatically actuable shutoff valve is not needed. For example, in the embodiment shown in FIG. 5, housing 55b of valved coupler 20b and housing 55c of valved coupler 20c are integrally formed with a housing for supporting a filter 120, which filters gas flow between main valve chamber 30b and main valve chamber 30c. Since, in a typical application, only one pneumatically-actuated shut-off valve is used on each side of the mass flow controller in a gas stick, there is no need for two pneumatically actuated shutoff valves on each side of filter 120. Accordingly, couplers 20a and 20b are configured for pneumatic control whereas couplers 20c and 20d are configured for manual control. In such an application, couplers 20c and 20d would be manually placed in a closed position only when the filter or an adjoining element is detached therefrom; otherwise, the manually actuated couplers 20c and 20d would remain in an open position.

As before, a filter element 120 and adjoining integral valved couplers could be supplied from the manufacturer in a controlled environment (e.g., in pure Nitrogen at a pressure slightly elevated above atmospheric) and pre-purged of impurities, permitting rapid installation of the filter into the gas stick and use after only a brief purging.

It is contemplated that other gas processing elements may similarly be isolated between valved couplers, or incorporated integrally into the housings of adjoining valved couplers, to obtain the advantages noted above. For example, as noted above, a purifier, or in-line regulator, might be positioned between or valved couplers, or the valved couplers might be integrally incorporated into the housings of these elements. Various embodiments and applications of this sort are discussed below in connection with FIG. 9.

Another application in which manually-actuated valved couplers might be used, is where a valved coupler is used to control flow of a high-pressure gas. In such a case, it may be impractical to use a pneumatically actuated valved coupler. For example, referring to FIG. 2, if a high pressure gas is input to coupler 20a via inlet line 14, when coupler valve stem 32a is in the open position, a large force would need to be applied (by spring 98b) to valve stem 32b to overcome the gas pressure and hold coupler 20b closed, i.e., in the position shown in FIG. 3. However, a large force of this kind, is likely to unacceptably deform gasket 58b over a few open-close cycles, and thereby dramatically reduce the number of cycles that could be obtained from the valve.

Accordingly, where a high pressure gas is in use, the input-side coupler 20b may be a manually-actuated coupler such as those shown in FIG. 5, which is opened after coupler 20b has been connected to coupler 20a, and left open throughout later processing. Coupler 20a (which is not subject to the pressures described in the previous paragraph) could then be cycled to provide a shut-off capability. As noted above, an example of a gas stick using a manually-actuated coupler is shown in FIG. 1, coupler 220.

In high-pressure applications, it is particularly important to incorporate a heater into the coupler such as heater 51 shown in FIG. 2. A pressure drop is likely to be experienced in the coupler, which will cause a temperature drop through the effect known as Joule-Thompson cooling. The temperature drop can be significant for particular gasses used in semiconductor processing. Accordingly, it is important to heat the coupler housing to prevent the condensation of gas or formation of icicles in the coupler.

Figure 6:
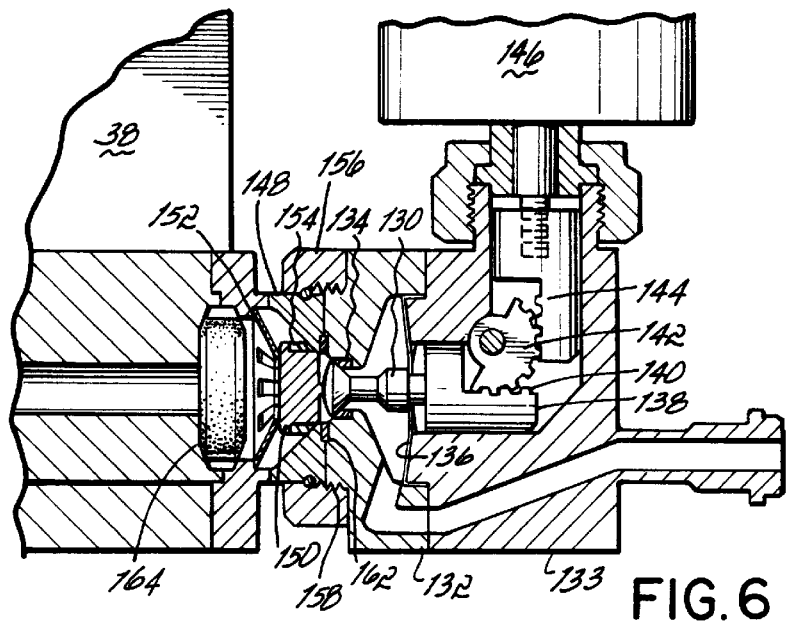
FIGS. 6 and 7 are partial cross-sectional views of an alternative embodiment of a valved coupler in accordance with principles of the present invention.

Now referring to FIG. 6, an alternative embodiment of the present invention includes a horizontally disposed valve stem 130 which engages a main valve housing 132 at a gasket 134. Valve stem 130 moves horizontally through housing 132. A disc-shaped diaphragm 136 is welded and clamped between valve stem 130 and an actuator 138, in a manner discussed above. Diaphragm 136 is further clamped at its outer peripheral edge between main housing 132 and actuator housing 133, providing a fluid-tight seal.

Actuator 138 includes a rack 140 of teeth engageable with a pinion 142. Pinion 142 is actuated by an actuator with a second rack of teeth 144, which is in turn coupled to, for example, a pneumatically actuated piston and cylinder assembly 146. Assembly 146 may include a spring return to return stem 130 to the closed position shown in FIG. 6, so that the valve returns to a seal when pneumatic pressure is removed. Alternatively, assembly 146 may return stem 130 to the open position in the absence of pneumatic pressure. As a second alternative, assembly 146 may include a manually-controlled actuator.

Figure 7:
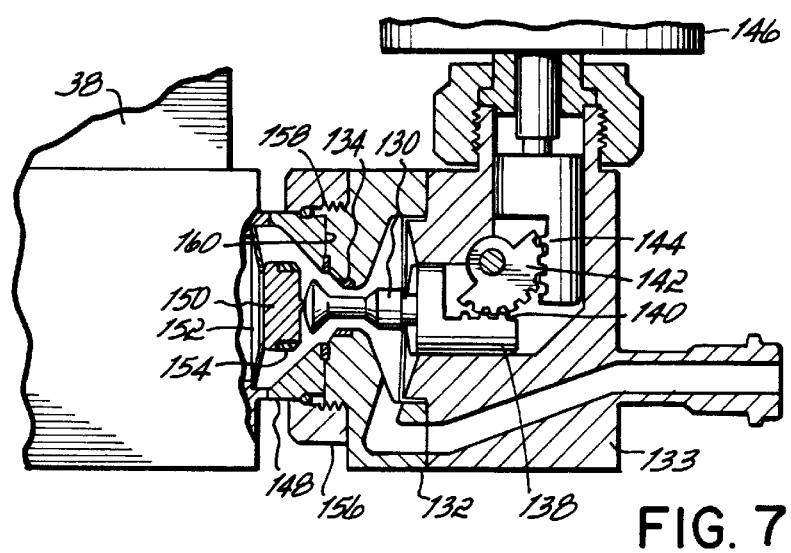

As seen by comparison of FIG. 6 and FIG. 7, when the valve is moved to an open position, rack 144 is ejected outward from assembly 146 in response to pneumatic actuation, causing rotation of pinion 142 clockwise about its axis and thereby causing horizontal movement of valve stem 130 away from gasket 134.

The main housing 132 may be coupled to a gas processing component such as a mass flow controller 38 or other component. Mass flow controller 38 includes an outer housing 148 having a substantially planar surface 160 for mating with main valve housing 132. A bull nose 150 is supported within outer housing 148 for actuation by valve stem 130. Bull nose 150 is spring biased into contact with outer housing 148 by a spider (annular spring) 152. Bull nose 150 carries a gasket 154 for sealing to outer housing 148 when in engagement therewith.

Outer housing 148 is held in engagement with main housing 132 by a nut 156 having an internal threaded surface 158 matable with external threads on main valve housing 132. Planar surface 160 of outer housing 148 mates to a similar planar surface 160 of main valve housing 132. A packing gland (deformable metal gasket) 162 inserted between outer housing 148 and main housing 132 provides a seal preventing fluid flow from inside of the valve housing.

As before, mass flow controller 38 may be integrally constructed with a filter 162, as well as other components such as a mass flow controller or a pressure sensor, and/or other components.

In use, comparing FIG. 6 to FIG. 7, it will be seen that horizontal actuation of valve stem 130 causes stem 130 to abut bullnose 150, and overcome the spring force of spider 152 to push bullnose 150 out of engagement with outer housing 148. Thus, in the position shown in FIG. 7, gas flow is permitted through the valve structure whereas in the position shown in FIG. 6, gas flow is inhibited.

Figure 8:
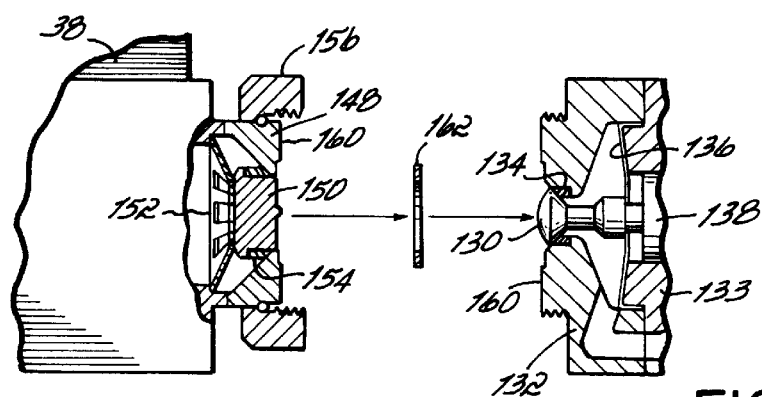
FIG. 8 is an uncoupled view of the alternative valved coupler of FIGS. 6 and 7.

As can be seen in FIG. 8, the valved coupling of FIGS. 6-7 may be disconnected along surfaces 160 and separated. In such a situation, valve stem 130 and bull nose 150 seal the interior wetted surfaces of the housings and adjacent structures so that, as before, moisture and dust are prevented from contacting those interior wetted surfaces.

Here, as in the first embodiment described with reference to FIGS. 1-5, the advantages of the present invention are obtained because valve stem 130 and bull nose 150, which move along a center axis extending through the aperture in the valve housings 132 and 148, come to rest at a position where the outer surface of the stem 130 and bull nose 150 is approximately coplanar with the adjoining surfaces 160 of the two sides of the coupler, so that a minimal wetted surface of the valve is exposed when the coupler is disconnected.

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art.

As one example, the gas stick illustrated in FIGS. 1 and 2 may be integrally combined with a pressure regulator, for example in place of pressure sensor 24 or in addition thereto. Further, the valved couplers may have a second inlet aperture, for example for purging gas.

As a second example, the disclosed valved couplers could be advantageously used in connection with other components in a gas distribution system to permit high-purity coupling/uncoupling of gas lines from these components.

Figure 9:
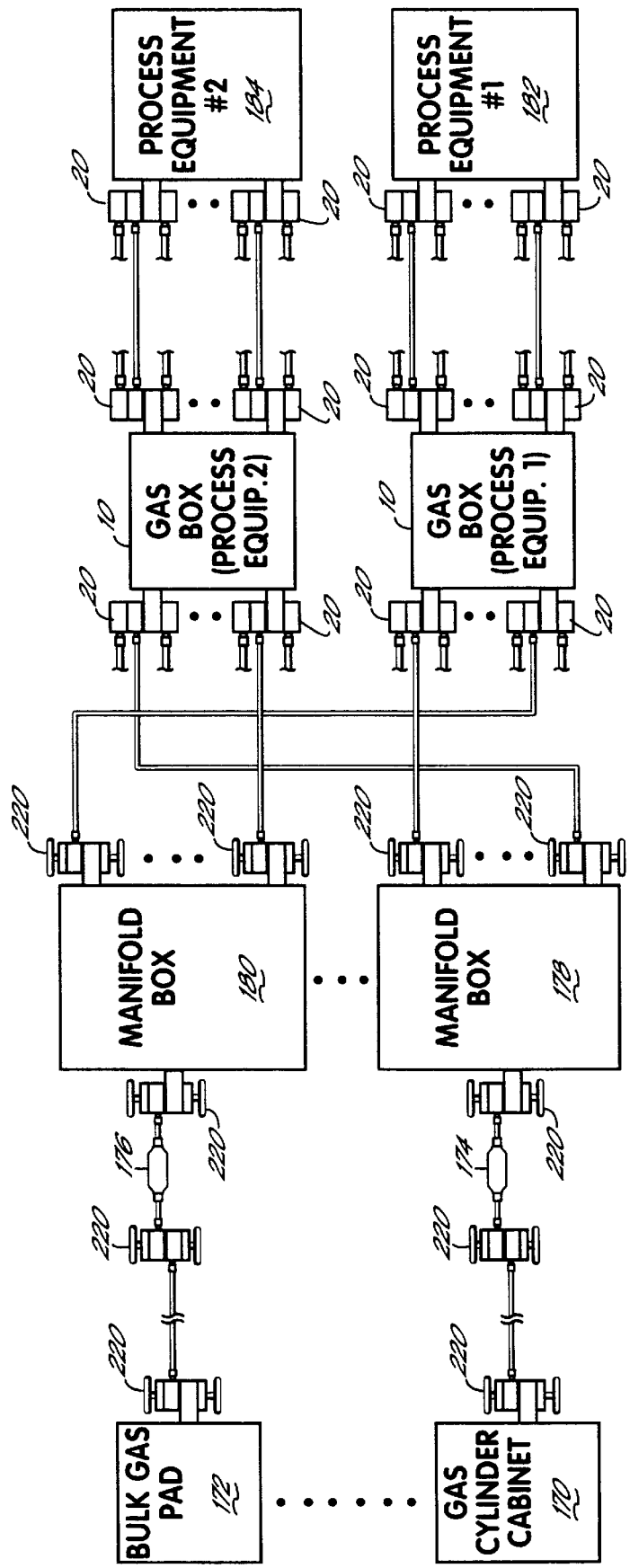
FIG. 9 is a schematic diagram of a complete gas distribution system using valved couplers in accordance with principles of the present invention.

Referring to FIG. 9, valved couplers 220 might be used at the connection of tubing to a gas source, e.g. a gas cylinder in a cylinder cabinet 170 or a tank on a gas pad 172. In these cases, a valved coupler in accordance with principles of the present invention might be formed integrally with or connected by tubing to a standard gas coupling.

Additional valved couplers 220 might be provided on either side of a purifier 174 and 176 to facilitate replacement of the purifier. Further valved couplings 220 might be provided on either side of a manifold box 178 and 180 which distributes gas from one of the sources 170 and 172 to multiple gas boxes 10. Also, couplers 20 might be used at the connections leading from a gas box to process equipment 182 and 184.

In a typical application, couplers 220 connected to the gas sources 170 and 172, purifier 174 and 176 and manifold boxes 178 and 180 would be manually-actuated couplers, as these connections are not typically opened and closed regularly during processing. However, couplers 20 attached to the gas boxes 10 and connected to the process equipment 182 and 184 would be pneumatically actuated since these connections are regularly opened and closed during processing.

Thus, the invention in its broader aspects is not limited to the specific details, representative apparatus and method, and illustrative example shown and described. Accordingly, departures may be made from such details without departing from the spirit or scope of applicant's general inventive concept.

What is claimed is:

1. A gas stick for ultra high purity gas distribution to a surface modifying apparatus using a gas as a precursor, such as a semiconductor manufacturing apparatus, comprising a housing assembly having an outer surface, an inner surface defining an inner gas-carrying chamber, and first and second aperture-defining surfaces extending from said inner surface to said outer surface and defining first and second apertures permitting gas flow into and out of said housing assembly, a mass flow controller positioned within said chamber for measuring flow of gas between said first and second apertures, a valving element slidably mounted within said housing assembly for linear translation between a first position and a second position, along an axis extending through said first aperture, wherein at said first position said valving element sealingly engages said first aperture-surrounding surface of said housing assembly, and an end of said valving element is substantially coplanar with said outer surface of said housing assembly in a region bordering said first aperture-defining surface, whereby said valving element seals said first aperture such that only a minimal extent of said inner surface of said housing assembly is exposed to an external environment.

2. The gas stick of claim 1 further comprising a second valving element slidably mounted within said housing assembly for linear translation between a first position and a second position, along an axis extending through said second aperture, wherein at said first position said second valving element sealingly engages said second aperture-surrounding surface of said housing assembly, and an end of said second valving element is substantially coplanar with said outer surface of said housing assembly in a region bordering said second aperture-defining surface, whereby said second valving element seals said second aperture such that only a minimal extent of said inner surface of said housing assembly is exposed to an external environment.

3. The gas stick of claim 2 packaged for shipment, wherein said chamber contains a controlled environment, said first and second valving elements are at their respective first positions sealing said first and second apertures and preventing entry of external environment into said chamber, and further comprising shipment packaging surrounding said outer surface of said housing assembly.

4. The packaged gas stick of claim 3 wherein said controlled environment comprises Nitrogen at a pressure slightly elevated above atmospheric pressure.

5. The gas stick of claim 1 further comprising a first filter positioned within said chamber for filtering gas passing between said first and second apertures.

6. The gas stick of claim 5 wherein said first filter is positioned to filter gas passing between said first aperture and said mass flow controller, and further comprising a second filter positioned to filter gas passing between said mass flow controller and said second aperture.

7. The gas stick of claim 6 further comprising a pressure sensor in fluid communication with said chamber for detecting a pressure level therein.

8. The gas stick of claim 7 wherein said pressure sensor is a pressure transducer generating an electrical signal related to pressure within said chamber.

9. The gas stick of claim 7 further comprising a gas purifier purifying gas flowing between said first and second apertures.

10. The gas stick of claim 6 further comprising a temperature sensor in thermal communication with chamber detecting temperature of gas flowing through said chamber.

11. The gas stick of claim 10 wherein said temperature sensor is a thermocouple producing an electrical signal representative of gas temperature.

12. The gas stick of claim 6 further comprising a pressure regulator regulating pressure of gas flowing between said first and second apertures.

13. The gas stick of claim 1 further comprising a spring applying a force between said housing assembly and said valving element to translate said valving element toward one of said first or second positions.

14. The gas stick of claim 1 further comprising a drive housing assembly defining a pneumatic actuating cylinder, and a third aperture in communication with said actuating cylinder for admitting compressed gas into said actuating cylinder, wherein said valving element further comprises a piston slidably mounted within said actuating cylinder, whereby said valving element may be actuated between said first position and said second position by injection of compressed gas into said drive housing assembly actuating cylinder through said third aperture.

15. The gas stick of claim 14 further comprising a spring applying a force between said drive housing assembly and said valving element to translate said valving element toward said first or second position in the absence of pneumatic force applied to said valving element, wherein said valving element may be actuated between said first position and said second position against force applied by said spring by injection of compressed gas into said drive housing assembly actuating cylinder through said third aperture.

16. The gas stick of claim 1 further comprising a handle engaged to said valving element for manual translation of said valving element along said axis.

17. The gas stick of claim 16, wherein said handle defines a bore having internal threads and is positioned for rotation within said housing assembly around said axis extending through said first aperture, and said valving element defines external threads matable with said internal threads of said handle, whereby rotation of said handle translates said valving element along said axis.

18. The gas stick of claim 1 wherein said valving element engages said aperture-surrounding surface adjacent said inner surface of said housing assembly, and translating said valving element from said first position to said second position comprises withdrawing said valving element into said housing assembly and away from said outer surface of said housing assembly.

19. The gas stick of claim 1 wherein said valving element engages said aperture-surrounding surface adjacent said outer surface of said housing assembly, and translating said valving element from said first position to said second position comprises extending said valving element out of said housing assembly such that said end of said valving element extends beyond said outer surface of said housing assembly.

20. A gas stick for ultra high purity gas distribution to a surface modifying apparatus using a gas as a precursor, such as a semiconductor manufacturing apparatus, comprising a housing assembly having an outer surface, an inner surface defining an inner gas-carrying chamber, and first and second aperture-defining surfaces extending from said inner surface to said outer surface and defining first and second apertures permitting gas flow into and out of said housing assembly, a mass flow controller positioned within said chamber for measuring flow of gas between said first and second apertures, a first valving element slidably mounted within said housing assembly between a first position and a second position, wherein at said first position said first valving element sealingly engages said first aperture-surrounding surface of said housing assembly, and at said second position said first valving element does not sealingly engage said first aperture-surrounding surface of said housing assembly, and a second valving element slidably mounted within said housing assembly between a first position and a second position, wherein at said first position said second valving element sealingly engages said second aperture-surrounding surface of said housing assembly, and at said second position said second valving element does not sealingly engage said second aperture-surrounding surface of said housing assembly, whereby said first and second valving elements control gas flow to or from said mass flow controller and, when in their respective first positions, also protect said inner gas-carrying chamber from exposure to environment.

21. A component having integral valved couplings for connection to an ultra high purity gas distribution system, comprising a housing assembly having an outer surface, an inner surface defining an inner gas-carrying chamber, and first and second aperture-defining surfaces extending from said inner surface to said outer surface and defining first and second apertures permitting gas flow into and out of said housing assembly, a gas processing element within said chamber for processing gas flowing between said first and second apertures, a first valving element slidably mounted within said housing assembly between a first position and a second position, wherein at said first position said first valving element sealingly engages said first aperture-defining surface of said housing assembly, and at said second position said first valving element does not sealingly engage said first aperture-defining surface of said housing assembly, and a second valving element slidably mounted within said housing assembly between a first position and a second position, wherein at said first position said second valving element sealingly engages said second aperture-defining surface of said housing assembly, and at said second position said second valving element does not sealingly engage said second aperture-defining surface of said housing assembly, whereby said first and second valving elements control gas flow to or from said gas processing element and, when in their respective first positions, also protect said inner gas-carrying chamber from exposure to environment.

* * * * *

UNITED STATES PATENT AND TRADEMARK OFFICE
CERTIFICATE OF CORRECTION

PATENT NO. : 5,810,031

DATED : September 22, 1998

INVENTOR(S) : Evans et al.

It is certified that error appears in the above-identified patent and that said Letters Patent is hereby corrected as shown below:

Column 1, line 57, delete "handing", insert --handling--.

Column 3, line 47, before "partial", insert --a--.

Column 4, line 27, delete "reduce", insert --reduces--.

Column 7, line 20, delete "70b/70b", insert --70a/70b--.

Column 7, line 49, delete "70b/70b", insert --70a/70b--.

Column 8, line 30, delete "94b/94b", insert --96b/96b--.

Column 10, line 18, delete "gas sticks", insert --gas stick--.

Column 12, line 32, delete "or".

Signed and Sealed this

Fifth Day of October, 1999

Attest:

Q. TODD DICKINSON

Attesting Officer

Acting Commissioner of Patents and Trademarks